United States Patent [19]
Hattori et al.

[11] Patent Number: 5,045,123
[45] Date of Patent: Sep. 3, 1991

[54] THERMOPILE

[75] Inventors: Takao Hattori, Chiba; Suiya Hoshikawa; Tatsuya Tsuda, both of Yokohama, all of Japan

[73] Assignee: Kabushiki Kaisha Toshiba, Kawasaki, Japan

[21] Appl. No.: 351,209

[22] Filed: May 15, 1989

[30] Foreign Application Priority Data

May 17, 1988 [JP] Japan .................................. 63-118049

[51] Int. Cl.$^5$ ...................... H01L 35/00; H01L 37/00
[52] U.S. Cl. .................................... 136/213; 136/212; 136/224; 136/225; 136/230
[58] Field of Search ............... 136/201, 208, 211, 212, 136/213, 214, 215, 216, 220, 228, 230, 236.1, 240, 241, 224, 231, 225, 227

[56] References Cited

U.S. PATENT DOCUMENTS

| | | | |
|---|---|---|---|
| 2,334,085 | 11/1943 | Graves et al. | 250/11 |
| 2,519,785 | 8/1950 | Okolicsanyi | 136/4 |
| 3,348,978 | 10/1967 | Teague | 136/214 |
| 3,480,775 | 11/1969 | Osborne | 250/83.3 |
| 3,554,815 | 1/1971 | Osborn | 136/203 |

FOREIGN PATENT DOCUMENTS 57-39338 3/1982 Japan .

OTHER PUBLICATIONS

Patent Abstract; 57-104827 (A); Jun. 30, 1982; Japan.
Patent Abstract; 55-95840 (A); Jul. 21, 1980; Japan.

*Primary Examiner*—Brooks H. Hunt
*Assistant Examiner*—Chrisman D. Carroll
*Attorney, Agent, or Firm*—Foley & Lardner

[57] ABSTRACT

Disclosed is a thermopile improved in its measurement sensitivity and manufacturing cost, which comprises a pillar-shaped substrate having a side extending in the parallel direction to an incident light to be measured so as not to be irradiated with the incident light, and first and second thermoelectric material layers arranged alternately on the side of the pillar-shaped substrate along the extending direction of the side of said pillar-shaped substrate. The first thermoelectric material layers and second thermoelectric material layers are connected each other in series such that one end of each first thermoelectric material is connected to one end of each second thermoelectric material at an incident-light side end portion of the side of said pillar-shaped substrate in the extending direction thereof and another end of each first thermoelectric material is connected to another end of each second thermoelectric material at the other end portion of the side of said pillar-shaped substrate opposite to the incident-light-side end portion in the extending direction thereof.

9 Claims, 7 Drawing Sheets

INCIDENT LIGHT

INCIDENT LIGHT

INCIDENT LIGHT

FIG. 3
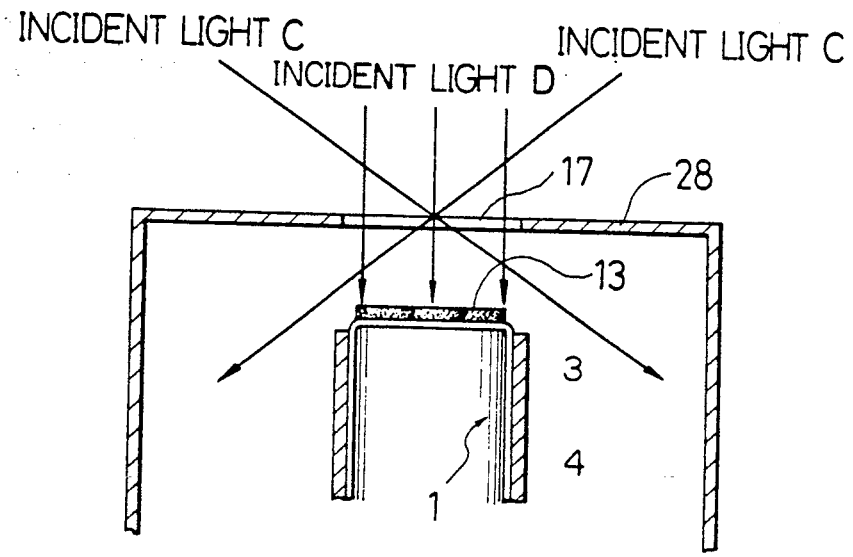
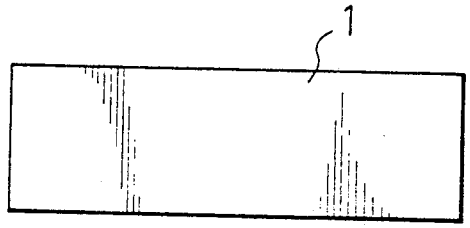
FIG. 4a
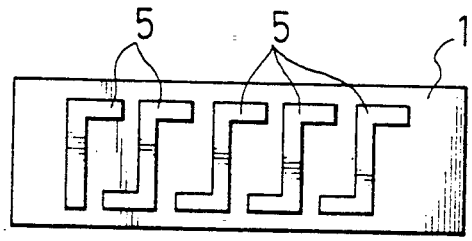
FIG. 4b
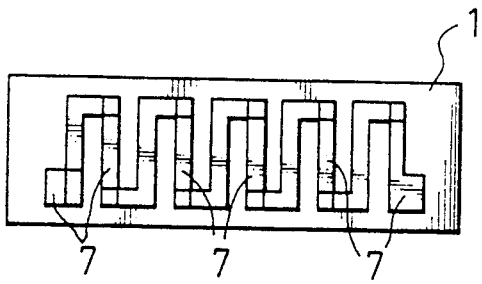
FIG. 4c
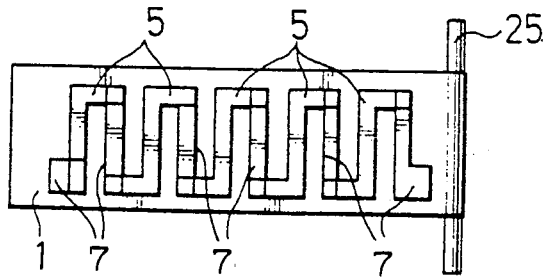
FIG. 4d

INCIDENT LIGHT

THERMOPILE

BACKGROUND OF THE INVENTION

1. Field of the Invention

The present invention relates to a thermopile used as an infrared rays detector, and particularly to a thermopile improved in its measurement sensitivity by enlarging the temperature differences between its hot junction portions and cold junction portions thereof.

2. Description of the Prior Art

A thermocouple for infrared ray detection utilizes the so called Seebeck effect, i.e., an effect causing a thermoelectromotive force when two kinds of metals or semiconductors having different thermoelectric characteristics from each other are junctioned and given different temperatures at their different junction portions. FIG. 1a shows a thermopile constructed by connecting a plurality of thermocouples in series to obtain a large thermoelectromotive force.

This thermopile has a pattern support thin film 50 formed on a substrate, and has a plurality of first and second thermoelectric material layers 51, 53 respectively, formed by, for example, photoetching technology. These first and second thermoelectric material layers 51 and 53 are connected to each other in series so as to construct a plurality of thermocouples 55.

Each thermocouple 55 has a hot junction portion A and a cold junction portion B. When the hot junction portion A is warmed by incident infrared rays, thermoelectromotive force is generated by temperature differences between the hot junction portions A and cold junction portions B. Thus, the infrared rays can be detected b measuring the thermoelectromotive force.

Namely, the thermopile has a light receiving portion 57 having a large infrared absorption ratio on the pattern support thin film 50, and the hot junction portion A of each the thermocouple 55 is arranged in the proximity of the light receiving portion 57. As shown in FIG. 1b, the foresaid support thin film 50 is housed in a can 59. In a portion of the can 59 right above the light receiving portion 57, there is provided a filter 61 having substantially the same shape as the light receiving portion 57 so as to transmit only the infrared rays having longer wave length than a predetermined one. The infrared rays (incident light D' in the same drawing) transmitted through the filter 61 are irradiated on the light receiving portion 57 on the thin film 50 and absorbed therein. As a result, temperature the of the receiving portion 57 is elevated, and the generated heat warms the hot junction portions A arranged in the proximity of the receiving portion 57. Thereby, the temperature difference between the hot junction portion A and cold junction portion B is enlarged, and the thermoelectromotive force is generated. Then, the infrared rays are detected by measurement of the thermoelectromotive force.

When an arrangement is achieved such that the temperature difference between the hot junction portion A of each the thermocouple and the cold junction portion B becomes large, the sensitivity of a thermopile becomes high.

In conventional thermopiles, if only the infrared rays like the incident light D', as shown in FIG. 1b, are transmitted, only the hot junction portions A are warmed, and the temperature difference between the hot junction portion A and cold junction portion B becomes relatively large. However, actually, there are other infrared rays (incident light C') obliquely transmitted through the filter 61. Some of the incident light C' is irradiated not on the light receiving portion 57 but on the cold junction portions B directly, and thereby the temperature difference between the hot junction portion A and cold junction portion B becomes small. Thus, the measurement sensitivity is decreased. This problem is thought to be mainly caused by a plane structure of the conventional thermopiles.

In order to solve the problem, some devices condense light onto the light receiving portion as much as possible by using a mirror condenser, such as a concave mirror or optical cone, and placing the light receiving portion at the focus thereof (Japanese Patent Publication Disclosure No. 57-104827). However, these thermopiles also have plane structures so that a part of the incident light can reach the cold junction portions directly. Thus, there still remains the problem that the temperature difference between the hot junction portion and the cold junction portion becomes small. Accordingly, there has been desired a drastical improvement so as to enlarge the temperature difference between the hot-cold junction portions.

Moreover, since the conventional thermopile as shown in FIG. 1 has a plane structure as mentioned above, it is difficult to form patterns of the thermocouple 55 efficiently on the pattern support thin film 50. Namely, since so called dead spaces 63 having relatively large areas are inevitably produced on the film 50, and the receiving portion 57 is provided at the mid-portion on the thin film 50, it is not possible to form the first and second thermoelectric material layer 51, 53 on the entire surface of the thin film 50. Accordingly, the number of patterns of the thermocouple 55 formed on the pattern support thin film 50 is considerably restricted.

SUMMARY OF THE INVENTION

Therefore, it is an object of the present invention to provide a thermopile which can realize a high sensitivity measurement.

It is another object of the present invention to provide a thermopile having a structure which can enlarge temperature differences between hot junction portions and cold junction portions thereof.

It is still another object of the present invention to provide a thermopile which can increase the number of thermocouple patterns per unit area in a thermopile element.

A feature of the present invention is a thermopile for detecting an incident light to be measured comprising;

a pillar-shaped substrate having a side extending in a parallel direction to the incident light to be measured such that the side is not irradiated with the incident light, and first and second thermoelectric material layers arranged alternately in series on the side of pillar-shaped substrate so as to form thermocouples respectively having the hot junction portions and cold junction portions therein.

The hot junction portions of the thermocouples are arranged at an incident-light-side end portion of the side of the pillar-shaped substrate, and the cold junction portions of the thermocouples are arranged at the other end portion of the side of the pillar shaped substrate opposite to the incident-light-side end portion.

Namely, since the pillar-shaped substrate is so placed that the vertical cross section thereof to its central axis is perpendicular to the incident direction of the light to be measured, and the hot junction portions of the thermocouples are arranged at the incident-light-side end portion of the side of the pillar-shaped substrate, further the cold junction portions of the thermocouples are arranged at the other end portion opposite to the incident-light-side end portion, the cold junction portions are not irradiated with the incident light and the temperature difference can be enlarged.

These and other objects, features and advantages of the present invention will be more apparent from the following description of a preferred embodiment, taken in conjunction with the accompanying drawings.

BRIEF DESCRIPTION OF THE DRAWING

FIG. 3 is an operational explanation view of the thermopile shown in FIG. 2;

DETAILED DESCRIPTION OF THE EMBODIMENT

Figure 2A:
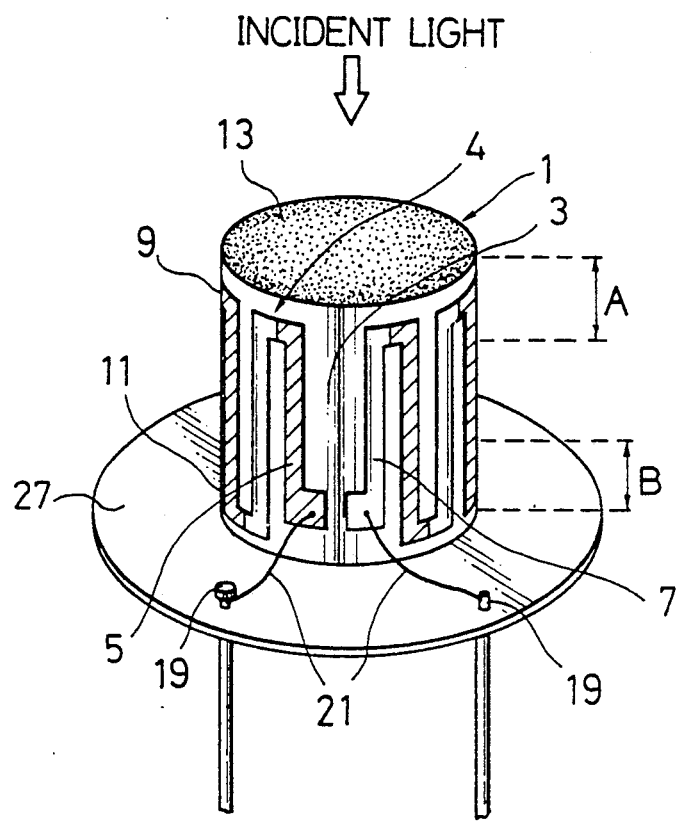
FIGS. 2a and 2b are structural views of an embodiment of a thermopile according to the present invention.
Figure 2B:
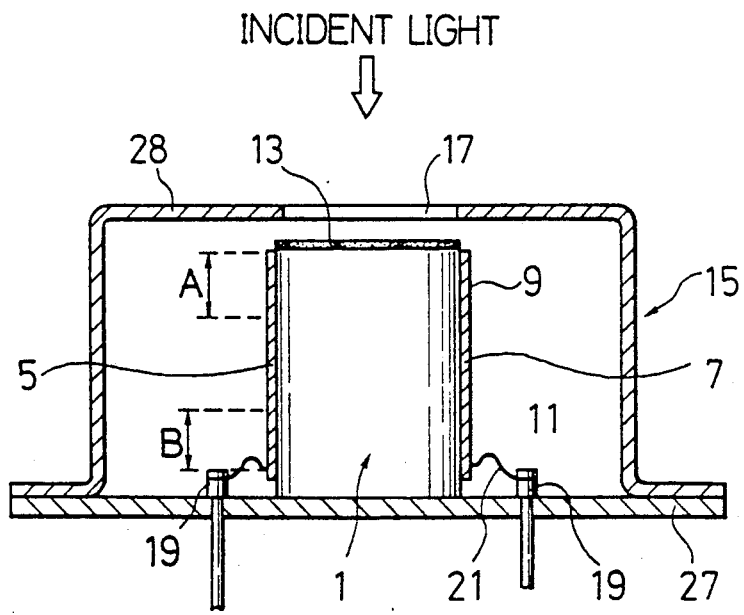

Referring to FIGS. 2a and 2b, a thermopile which embodies the present invention has a pillar-shaped pattern support substrate 1 consisting of polyimide or polyester and having a cylindrical shape. A side 3 of the pattern support substrate 1 is parallel to an incident light. On the side 3, there are provided first and second thermoelectric material layers 5 and 7 alternately in series so as to form thermocouples respectively having hot junction portions A and cold junction portions B therein. Moreover, the hot junction portions A are arranged at an incident-light-side end portion 9 of the side 3 of the pillar-shaped pattern support substrate 1, and the cold junction portions B are arranged at the other end portion 11 of the side 3 of the pillar-shaped pattern support substrate 1 opposite to the incident-light-side end portion 9. The upper cross section of the pillar-shaped pattern support substrate 1 is perpendicular to the incident light. To the upper cross section, there is attached a cap 13 subjected to a blackening treatment and having a sufficient heat-conductivity as a light receiving portion for receiving the incident infrared rays.

The first and second thermoelectric material layers 5, 7 respectively use, for example, Bi and Sb as their materials, and are formed by vacuum metallizing or sputtering in combination with a metal-mask method or photomask method.

As shown in FIG. 2b, the pillar-shaped pattern support substrate 1 is housed in a cylindrical can 15 so as to restrict the incident light. In a portion of the top side of the can 15 right above the light receiving portion 13 of the pillar-shaped pattern support substrate 1, there is provided an infrared transmission filter 17 of a cut-on wave length of 6.0 μm. The filter 17 has substantially the same shape as the light receiving portion 13.

As also shown in FIG. 2a, the end portions of the first and second thermoelectric material layers 5, 7 are connected to bonding wires 21 for conducting the thermoelectromotive force generated at lead terminals 19.

In FIG. 2b, only infrared rays over 6.0 μm of the incident light irradiated on the thermopile can be transmitted through the filter 17, and absorbed in the light receiving portion 13, and then converted into heat. Thereby, temperature of the hot junction portions A of the thermocouples 4 arranged at the incident-side portion 9 in the proximty of the light receiving portion 13 is elevated. While, temperature of the cold junction portions B is not elevated because these are located at a remote place from the light receiving portion 13. As shown in FIG. 3, the incident infrared rays (designated D) which are transmitted through the filter 17 and irradiated vertically onto the light receiving portion 13 are absorbed therein. The other incident lights (designated C) obliquely transmitted through the filter 17 are not irradiated on the hot and cold junction portions A and B arranged in parallel to the incident light D, but are irradiated on the can 15. Thus, the hot and cold junction portions A and B, particularly the latter, are not warmed by the, obliquely transmitted incident lights.

According to the above-mentioned embodiment of the present invention, since the thermocouple patterns are arranged in parallel to the incident light and the cold junction portions B are arranged at a remote place from the light receiving portion 13, the cold junction portions B are not warmed at all by the incident light, and sufficient temperature differences are produced between respective hot junction portions and cold junction portions A and B. Thus, stable and large thermoelectromotive force can be obtained from the entire body of the thermopile.

Figure 1A:
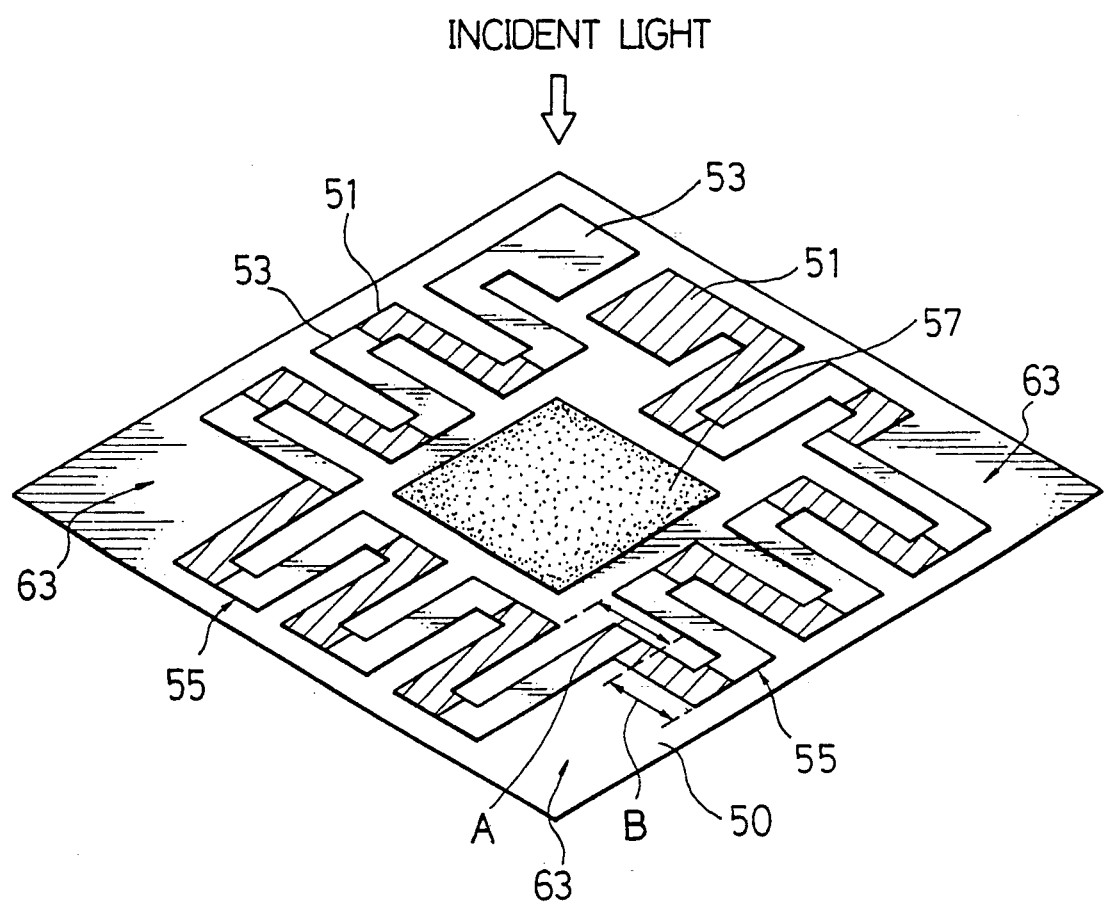
FIGS. 1a and 1b are structural views of a conventional thermopile.
Figure 1B:
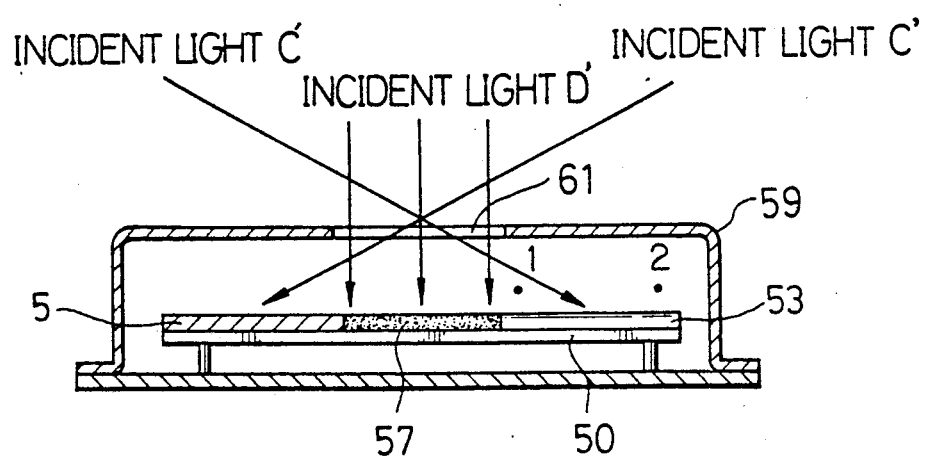

Table 1 shows measurement results of temperatures between 1 and 2, and 3 and 4 in space 2 mm above the hot and cold junction portions in a conventional example as shown in FIG. 1b and the embodiment of the present invention as shown in FIG. 3 respectively. As is apparently known from the table, the temperature difference in the embodiment of the present invention is relatively large as compared with that in the conventional example.

TABLE 1

| Measurement Point | Temperature (°C.) | Temperature Difference (°C.) |
|---|---|---|
| 1 | 26.3 | >0.3 |
| 2 | 26.0 | |
| 3 | 26.1 | >0.9 |
| 4 | 25.2 | |

While, the thermoelectromotive force generated by the temperature differences like these are shown in Table 2. This table shows measurement results of thermoelectromotive force respectively generated corresponding to infrared rays radiated from dummy black bodies having a surface temperature of 40° C. of the embodiment of the present invention, a thermopile having a conventional structure (Comparative Example 1), and another thermopile having the same structure as the conventional one and further having cold junction portions covered by heat reflective film (Comparative Example 2). The number of pairs of the thermocouples used in the embodiment of the present invention and comparative examples is 10 in common.

TABLE 2

| | |
|---|---|
| Embodiment | 125 μV |
| Comparative Example 1 | 83 μV |
| Comparative Example 2 | 101 μV |

As is apparently known from the table, the output generated from the embodiment of the present invention is increased by about 50% compared with that generated from Comparative Example 1, and about 24% compared with Comparative Example 2, and thus improvement of the measurement sensitivity in the embodiment can be obviously recognized.

Hereinafter, a manufacturing process of the above-mentioned thermopile in accordance with the present invention will be described on reference to FIGS. 4 and 5.

Figure 4E:
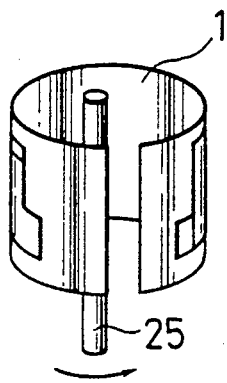
FIGS. 4a to 4o are explanation views of a manufacturing process of the thermopile according to the present invention shown in FIG. 2.
Figure 5:
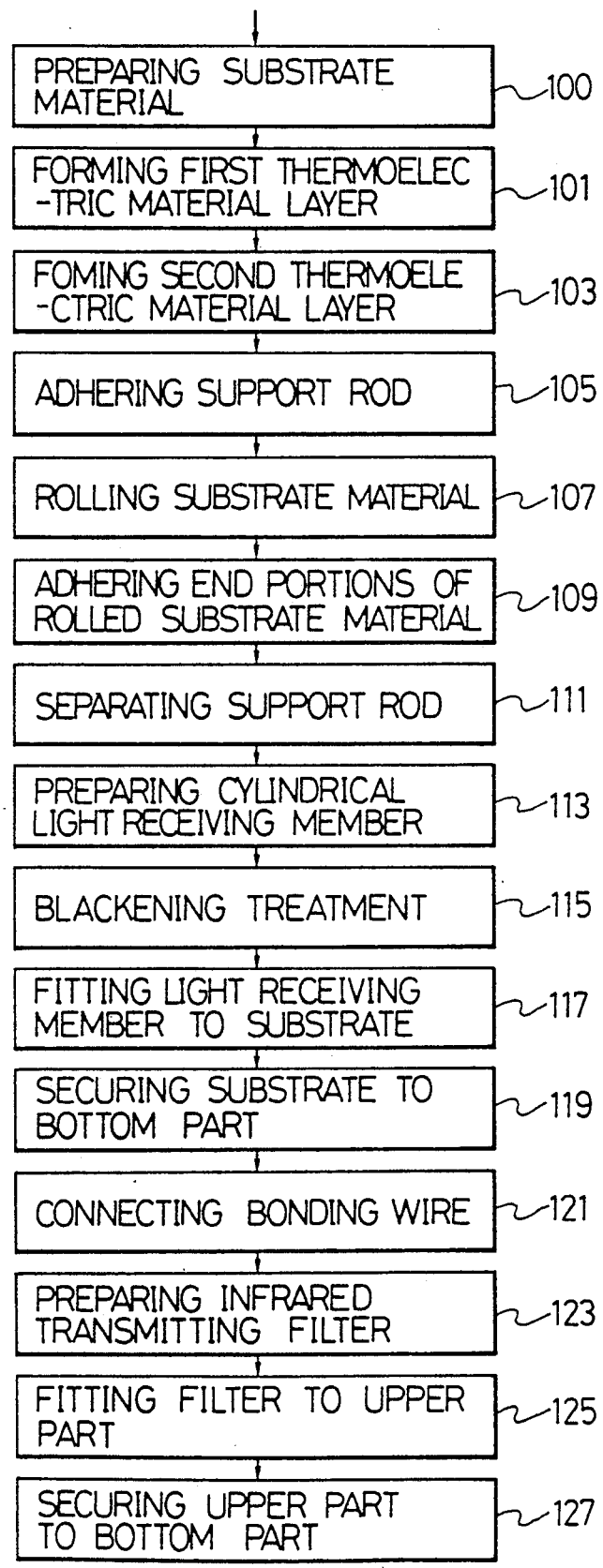
FIGS. 5 is a flow chart of the manufacturing process shown in FIGS. 4a to 4o.

A substrate material 1 consisting of an elastic material such as polyimide or polyester is prepared as shown in FIG. 4a (step 100 in FIG. 5).

Then, in step 101, first thermoelectric material layers 5 consisting of Bi are formed on the substrate material 1 as shown in FIG. 4b.

Thereafter, in step 103, second thermoelectric material layers 7 consisting of Sb are formed on the substrate material 1 already having the first thermoelectric material layers 5 thereon, so that thermocouples respectively having hot junction portions A and cold junction portions B therein are formed on the substrate material 1 as shown in FIG. 4c.

As also shown in FIG. 4c, the foresaid thermocouples are arranged on the substrate material 1 extremely efficiently, and thus the dead spaces 63 as shown in the conventional example in FIG. 1 are almost eliminated from the substrate material 1.

Accordingly, by the structure as arranged above, the number of the thermocouple patterns per unit area of a thermopile element can be increased.

In step 105, a support rod 25 is adhered with an adhesive or the like to one lateral end portion of the substrate material 1 having the first and second thermoelectric material layers 5, 7 as shown in FIGS. 4c and 4d.

Figure 4F:
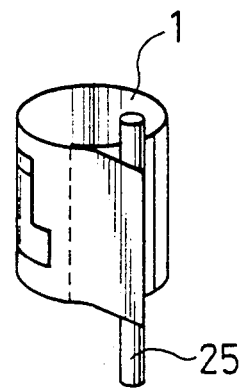
Figure 4G:
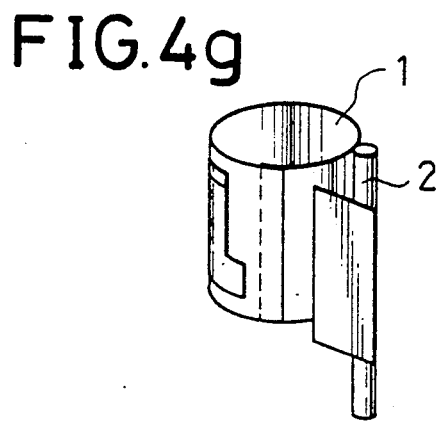

Next, in step 107, the foresaid substrate material 1 is rolled as shown in FIG. 4e, and then in steps 109 and 111, both the lateral end portions of the rolled substrate material 1 are adhered to each other, and the support rod 25 is separated from the substrate material 1 as shown in FIGS. 4f and 4g respectively.

Figure 4H:
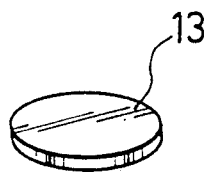
Figure 4J:
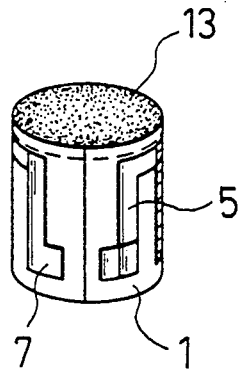
Figure 4I:
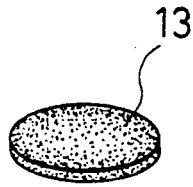
Figure 4K:
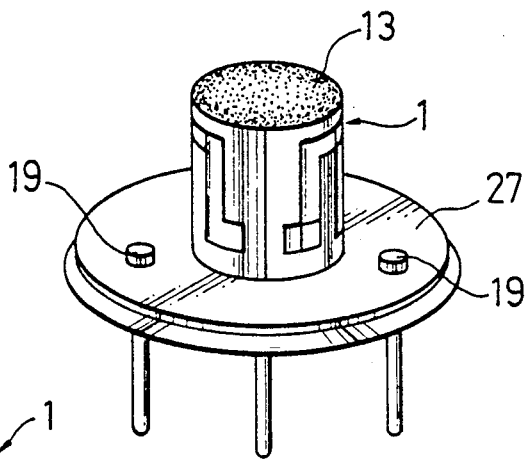

In step 113, a cylindrical light receiving member 13 consisting of polyimide or polyester is prepared as shown in FIG. 4h. Thereafter, in step 115, the light receiving member 13 is subjected to a blackening treatment by a vacuum metallization with Au as shown in FIG. 4i. Then, in step 117, the light receiving portion 13 is fitted around the upper portion of the pillar-shaped pattern support substrate 1 and fixed thereto by caulking as shown in FIG. 4j.

Figure 4L:
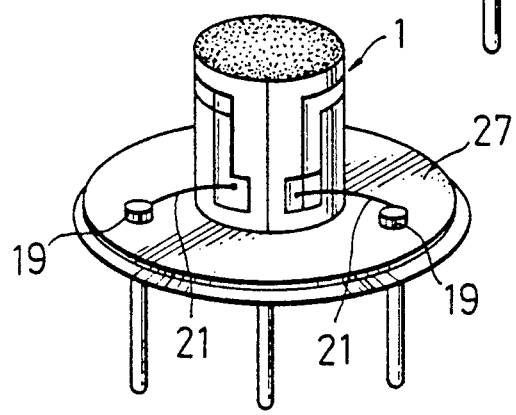
Figure 4M:
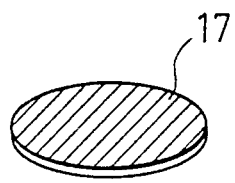
Figure 4N:
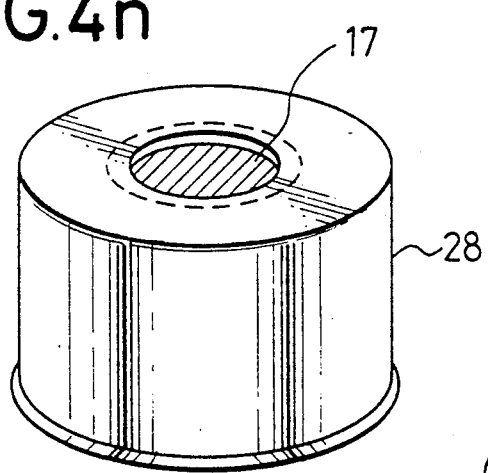
Figure 4O:
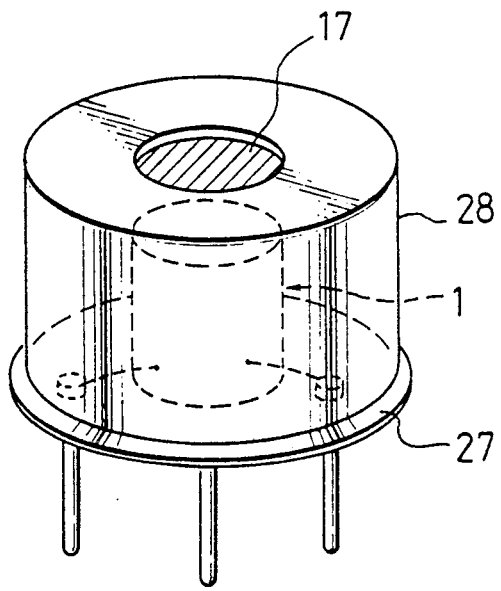

Subsequently, in step 119, the pillar-shaped pattern support substrate 1 is secured to the bottom part 27 of a can 15 with a heat-conductive adhesive as shown in FIG. 3k, and further, in step 121, the end portions of the foresaid first and second thermoelectric material layers 5, 7 are respectively connected to lead terminals 19 with bonding wires 21 as shown in FIG. 4l. Then, in step 123, an infrared transmission filter 17 consisting of Si or the like is prepared as shown in FIG. 4m, and in step 125, the infrared transmission filter 17 is fitted in an opening formed in the top side of the upper part 28 of the can 15 as shown in FIG. 4n. In step 127, the upper part 28 and the bottom part 27 of the can 15 are secured to each other to construct a thermopile as shown in FIG. 4o.

Figure 6B:
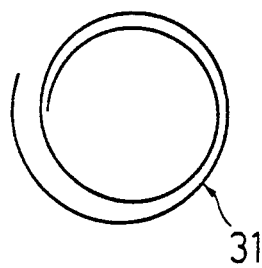
FIGS. 6a to 6c are structural views of another embodiment of a thermopile according to the present invention.

Hereinafter, another embodiment of a thermopile according to the present invention will be described on reference to FIGS. 6a to 6c.

Figure 6A:
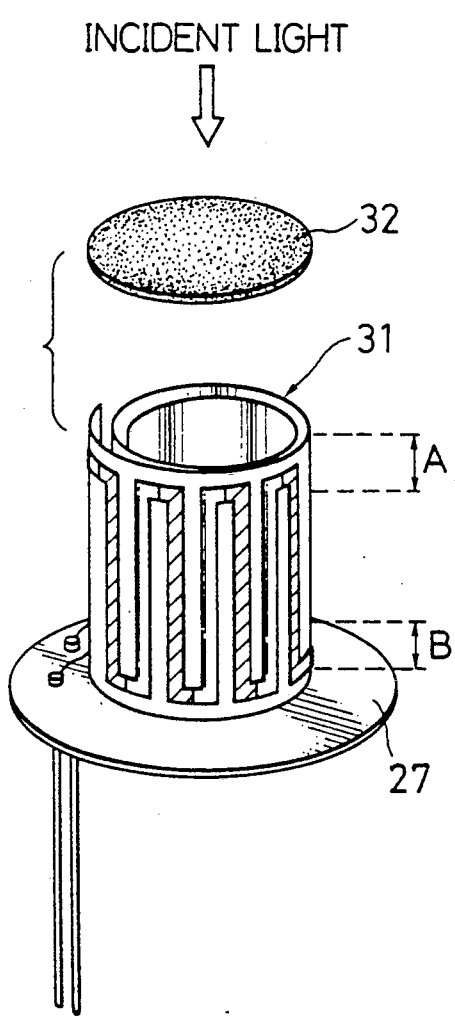
Figure 6C:
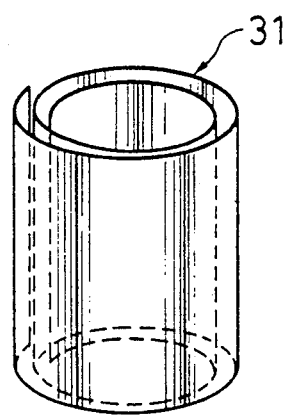

As shown in FIG. 6a, in this embodiment, a pillar-shaped support substrate 31 has a multi-rolled structure, while a light receiving portion 32 has a plane structure. The other constitution is the same as the above-mentioned first embodiment, thus its detailed explanation will be omitted.

According to the multi-rolled structure, as compared with the first embodiment, since an area of the pillar-shaped support substrate 31 can be enlarged, the number of the thermocouple patterns per a thermopile element can be further increased. Thus, there can be provided a thermopile more improved in its measurement sensitivity.

In summary, according to the present invention, since the pillar-shaped support substrate is so arranged that the vertical cross section thereof to its central axis verticaly faces to the incident direction of the light to be measured, and the hot junction portions of the thermocouples are arranged at the incident-light-side end portion of the side of the pillar-shaped substrate, further the cold junction portions of the thermocouples are arranged at the other end portion opposite to the incident-light-side end portion, the cold junction portions are not irradiated with the incident light directly and the temperature difference can be enlarged so much, thus there can be provided a thermopile having an excellent measurement sensitivity.

Further, since the thermocouple patterns are formed on the side of the pillar-shaped support substrate, the number of the thermocouple patterns per unit area of a thermopile element can be increased, and thus there can be provided a thermopile extremely superb in its measurement sensitivity and manufacturing cost.

Various modifications will become possible for those skilled in the art after receiving the teachings of the present disclosure without departing from the scope thereof.

What is claimed is:

1. A thermopile for detecting incident light to be measured comprising;
   (a) a pillar-shaped substrate having a side extending in the parallel direction to said incident light to be measured such that the side is not irradiated with the incident light,
   (b) a plurality of first and second thermoelectric material layers arranged alternately on the side of said pillar-shaped substrate along the extending direction of the side of said pillar-shaped substrate,
   (c) said first thermoelectric material layers and second thermoelectric material layers being connected to each other in series such that one end of each first thermoelectric material is connected to one end of each second thermoelectric material at an incident-light side end portion of the side of said pillar-shaped substrate in the extending direction thereof to form hot junctions and another end of each first thermoelectric material is connected to another end of each second thermoelectric material at the other end portion of the side of said pillar-shaped substrate opposite to the incident-light-side end portion in the extending direction thereof to form cold junctions, and (d) a light shielding structure for blocking light from being incident on said substrate except through a window located just above said one ends.

2. The thermopile according to claim 1, wherein the connections of the one ends of the first and second thermoelectric materials at the incident-light side end portion are hot junction portions and the connections of the other ends of the first and second thermoelectric materials at the other end portion are opposite to the incident-light-side end portion are cold junction portions.

3. The thermopile according to claim 2, further comprising:

a light receiving portion arranged at the top said pillar-shaped substrate for receiving the incident light to be measured.

4. The thermopile according to claim 3, further comprising:

a housing for containing said pillar-shaped substrate so as to restrict the incident light, said housing having an infrared transmission filter with substantially the same shape as said light receiving portion at a portion of the top side thereof right above said light receiving portion of said pillar-shaped substrate.

5. The thermopile according to claim 4, wherein a vertical cross section of said pillar-shaped substrate to its central axis is perpendicular to the incident light transmitted through the infrared transmission filter of said housing.

6. The thermopile according to claim 2, wherein said pillar-shaped substrate has a single-rolled structure.

7. The thermopile according to claim 2, wherein said pillar-shaped substrate has a multi-rolled structure.

8. A method of producing a thermopile which detects an incident light to be measured, comprising the steps of:

(a) preparing an elastic substrate material;

(b) forming first thermoelectric material layers on the substrate material;

(c) forming second thermoelectric material layers on the substrate material having the first thermoelectric material layers to form thermocouples;

(d) rolling the substrate material having the thermocouples to form a pillar-shaped pattern support substrate;

(e) fitting a light receiving portion at an upper portion of the pillar-shaped pattern support substrate; and (f) containing the pillar-shaped substrate to restrict the incident light.

9. A thermopile for detecting infrared rays comprising:

a pillar structure comprising an upper surface and a side surface extending downward and perpendicular to said upper surface;

a plurality of thermocouples connected in series and formed on said side surface in order that the hot junctions of said thermocouples are located in upper positions near said upper surface and the cold junctions located in lower positions spaced apart from said upper surface; and an enclosure for keeping said pillar structure from receiving external radiation except rays passing through an IR filter located just above said upper surface.

* * * * *